United States Patent [19]
Tamura et al.

[11] Patent Number: 6,024,852
[45] Date of Patent: Feb. 15, 2000

[54] SPUTTERING TARGET AND PRODUCTION METHOD THEREOF

[75] Inventors: Hidemasa Tamura; Norio Yokoyama; Eiichi Shimizu; Fumio Sasaki, all of Miyagi, Japan

[73] Assignee: Sony Corporation, Tokyo, Japan

[21] Appl. No.: 08/984,132

[22] Filed: Dec. 3, 1997

[30] Foreign Application Priority Data

Dec. 4, 1996 [JP] Japan ................................. 8-324264

[51] Int. Cl.⁷ ........................ C23C 14/00; C22C 14/00
[52] U.S. Cl. ........................... 204/298.12; 204/298.13; 204/192.1; 420/417; 148/421
[58] Field of Search ................... 204/298.12, 298.13, 204/192.12, 192.15; 148/421; 420/417; 216/52

[56] References Cited

U.S. PATENT DOCUMENTS

| | | | |
|---|---|---|---|
| 5,178,739 | 1/1993 | Barnes et al. | 204/192.12 |
| 5,447,616 | 9/1995 | Satou et al. | 204/298.13 |
| 5,676,803 | 10/1997 | Demaray et al. | 204/192.12 |

*Primary Examiner*—Yogendra Gupta
*Assistant Examiner*—Derrick G. Hamlin
*Attorney, Agent, or Firm*—Hill & Simpson

[57] ABSTRACT

The present invention provides a sputtering target which generates a reduced quantity of particles during a sputtering and a method for producing such a sputtering target.

Mirror treatment is carried out to a sputter surface 2 which is sputtered when forming a thin film, so that the sputter surface 2 has an arithmetic mean roughness Ra of 0.01 μm or below. A sputtering target 1 with such a smooth sputter surface 2 having a small surface roughness enables to reduce a number of particles generated during a sputtering.

6 Claims, 6 Drawing Sheets

SPUTTERING TARGET AND PRODUCTION METHOD THEREOF

BACKGROUND OF THE INVENTION

1. Field of the Invention

The present invention relates to a sputtering target and its production method in which generation of particles is reduced during sputtering.

2. Description of the Prior Art

The sputtering is mainly used in the field of a semiconductor device for forming a thin film constituting the semiconductor device. When forming a thin film by way of sputtering, accelerated particles are applied to a surface of a sputtering target serving as a sputtering source. Then, by the exchange of momentum, atoms constituting the sputtering target are discharged into a space, which particles are accumulated on a substrate which is arranged at a position opposing to the sputtering target, thus forming a thin film on the substrate.

When forming a thin film by way of sputtering, normally, fine particles are generated as dust from the sputtering target during the sputtering process. If such particles adhere to the semiconductor device, this causes defects of the semiconductor device. Especially in these years when the integrated circuit using a semiconductor device is increasing its integrity, such particles cause to lower the yield of the integrated circuit. Consequently, suppressing generation of such particles has become a very important object.

SUMMARY OF THE INVENTION

It is therefore an object of the present invention to provide a sputtering target which generates a reduced quantity of particles during a sputtering, and its production method.

In order to achieve the aforementioned object, the inventor of the present invention has conducted various experiments to find that a quantity of particles generated during sputtering depends on a surface roughness of the sputtering target and that by making smooth the surface to be sputtered, it is possible to reduce the quantity of particles generated.

The present invention is based on the aforementioned and a sputtering target according to the present invention has a sputter surface having an arithmetic mean roughness Ra of 0.01 $\mu$m or below.

On the other hand, a sputtering target production method according to the present invention is characterized by carrying out a mirror treatment on a sputter surface so as to have an arithmetic mean roughness Ra of 0.01 $\mu$m or below.

The sputtering target according to the present invention and the sputter target prepared according to the present invention have a sputter surface of an arithmetic mean roughness equal to or below 0.01 $\mu$m, which enables to reduce the quantity of particles generated during sputtering.

DETAILED DESCRIPTION OF PREFERRED EMBODIMENTS

Description will now be directed to preferred embodiments of the present invention with reference to the attached drawings. It should be noted that the present invention is not limited to the embodiments explained below but can be modified in various ways within the scope of the invention.

Figure 1:
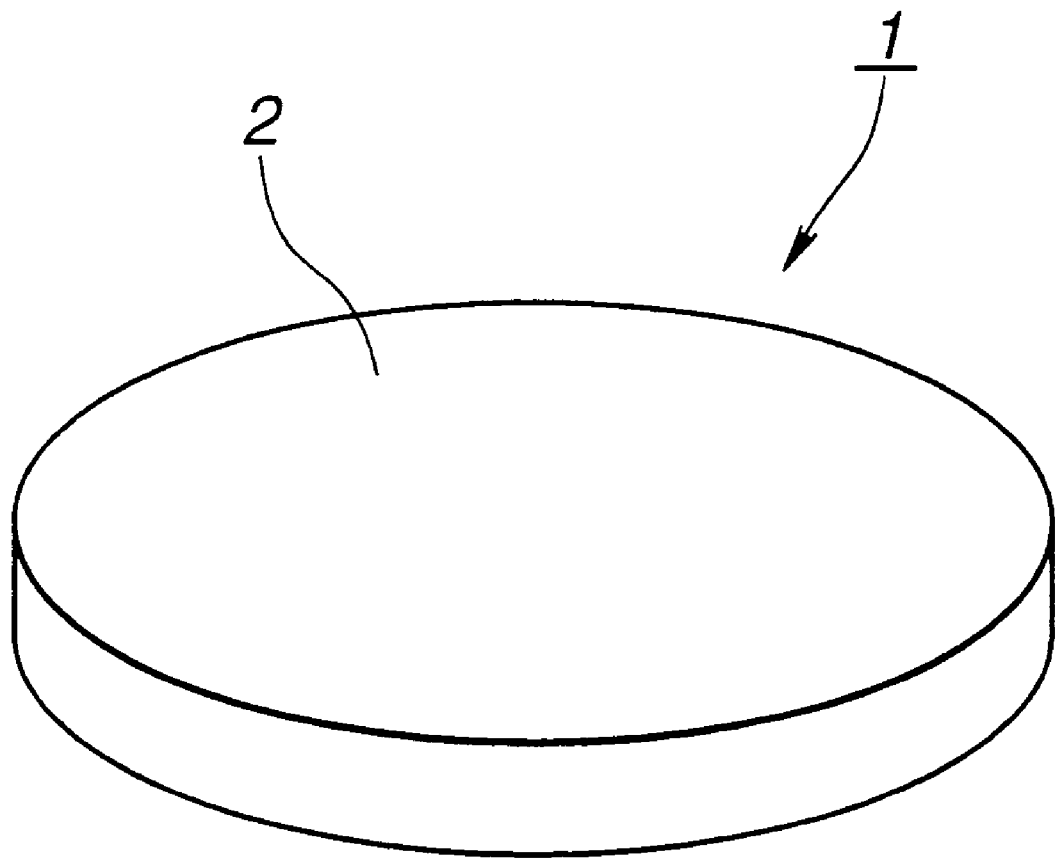
FIG. 1 is a perspective view showing an example of sputtering target according to the present invention.

As shown in FIG. 1, a sputtering target 1 according to the present invention is made from Ti and has a disk shape. The sputtering target 1 normally has a disk shape as shown in FIG. 1 but may have a shape other than a disk shape if applicable to a sputtering apparatus used.

The sputtering target 1 according to the present invention has a sputter surface 2 on which a thin film is to be formed by sputtering is a concave surface having a predetermined curvature R and an arithmetic mean roughness Ra of 0.01 $\mu$m or below. Thus, the sputtering target 1 has the sputter surface 2 of a small surface roughness, which enables to reduce particle generation during a sputtering.

The sputtering target 1 is bonded to a backing plate which serves for supporting and cooling this sputtering target 1 and is mounted on a sputtering apparatus, so as to serve as a sputtering source for forming a thin film by way of sputtering.

It should be noted that the sputtering target 1 may be made from a material other than Ti according to the thin film required. More specifically, such materials may be a Ti alloy made from Ti with addition of Al, Sn, V, W or the like, Al or Al alloy, a metal having a high melting point such as W and Mo, and silicide having a high melting point such as $MoSi_x$, $CoSi_x$, and $WSi_x$.

Compared to a process for forming a simple Ti film, a process for forming a Ti—N film by way of reactive sputtering using a sputtering target 1 made from Ti or a Ti alloy tends to generate more particles during the sputtering. Consequently, the effect of the present invention is more remarkable when applied to a sputtering target made from Ti or a Ti alloy used for a process for forming a Ti—N film by way of the reactive sputtering method.

Moreover, the sputtering target 1 has preferably a small crystal grain size equal to or below 20 $\mu$m. When the crystal grain size is small, the particle generation can be further suppressed.

Description will now be directed to a production method of the aforementioned sputtering target 1.

When producing the aforementioned sputtering target 1, firstly, a billet made from Ti is subjected to a predetermined thermal treatment and hammering, and then to a rolling process so as to be rolled into a predetermined configuration. The crystal grain size and the crystal axis direction of the sputtering target 1 are determined by these thermal treatment, hammering, and rolling processes. After this, the sputtering target 1 is further subjected to a thermal treatment if necessary before being subjected to a mechanical processing so as to be made into a disk shape as shown in FIG. 1.

According to the present invention, in this mechanical processing, the sputter surface 2 of the sputtering target 1 is made into a concave surface having a predetermined curvature 2, which is subjected to a mirror treatment so as to have an arithmetic mean roughness Ra of 0.01 $\mu$m or below.

Here, the mirror treatment is carried out by lapping by successively using a slurry containing alumina of #300, a slurry containing alumina of #600, and a slurry containing alumina of #1200. After this, polishing of the so-called wet method is carried out by successively using a paste containing diamond of an average grain size of 15 μm, a paste containing diamond of an average grain size of 6 μm, and a paste containing diamond of an average grain size of 2 μm. It should be noted that stress caused in the sputter target 1 by the aforementioned lapping is eliminated by this polishing of the wet method. After this, as a finishing process, a slurry containing silica of an average grain size of 1 μm or below is used for polishing. After these processes are carried out to the sputter surface 2, the sputter surface 2 has an arithmetic mean roughness Ra of 0.01 μm or below.

Note that the mirror processing is not limited to the aforementioned mechanical polishing but can be carried out, for example, by mechanochemical polishing. i.e., using mechanical polishing and chemical etching in combination. Here, the mechanochemical polishing may be carried out, for example, by using a polishing liquid containing grinding grain such as colloidal silica, $SiO_2$ ultragrains (amicron), diamond, or $ZrO_2$ grain in an amount of 10 to 40 weight % dispersed in an alkalescent solvent of pH 9.0 to 12.0, so that polishing is carried out by mechanical grinding by the grain contained in the polishing liquid and the chemical etching by the alkali solution in combination. In such a mechanochemical polishing, it is possible to control speed of the chemical polishing by changing pH of the polishing solution and to control speed of the mechanical grinding by changing the type and concentration of the grain contained in the polishing liquid.

The sputtering target 1 produced as described above has the sputter surface 2 which has been subjected to the mirror treatment so as to have a small surface roughness and enables to reduce the particle generation during sputtering.

It should be noted that in order to reduce the particle generation, it is preferable to reduce the arithmetic mean roughness Ra as much as possible. However, to reduce the arithmetic mean roughness Ra to such a small value, it takes a plenty of time and care for the mirror treatment. Moreover, it is possible to obtain the effect of the present invention to reduce the particle generation if the spatter surface 2 has an arithmetic mean roughness Ra equal to or below 0.01 μm. Consequently, the arithmetic mean roughness Ra of the sputter surface 2 may be selected within a range equal to or below 0.01 μm according to the allowance of particle generation with consideration of the time and care required for the mirror treatment.

Description will now be directed to actual measurement of particles generated when using a sputtering target made from Ti to form a Ti—N film which is widely used as a barrier film in the semiconductor device. Here, the particle generation when using the sputtering target according to the present invention is compared to particle generation when using a conventional sputtering target.

EXAMPLE

Figure 2:
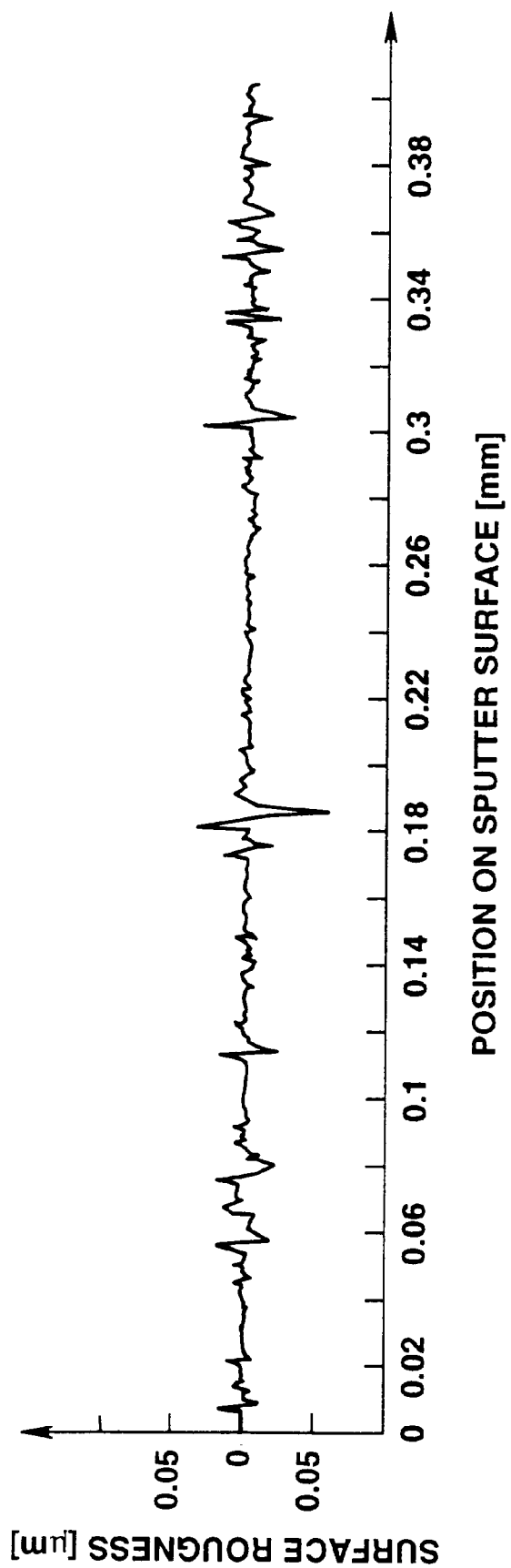
FIG. 2 shows results of measurement of a surface roughness of a sputtering target according to an embodiment of the present invention.

An example of a sputtering target was prepared according to an embodiment of the present invention from Ti having a crystal grain size of 10 μm. This sputtering target was subjected to the aforementioned mirror treatment on the sputter surface. For this sputtering target, the surface roughness of the sputter surface was measured and the result is shown in FIG. 2. As shown in FIG. 2, the sputter surface of this sputtering target is significantly smooth and its arithmetic mean roughness Ra was measured to be approximately 0.004 μm.

Comparative Example 1

Figure 3:
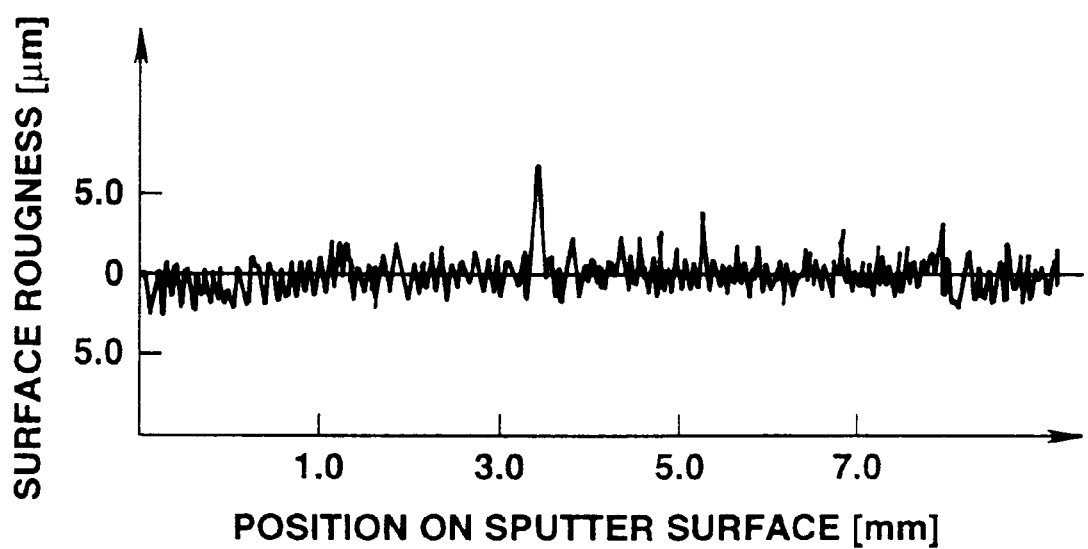
FIG. 3 shows results of measurement of a surface roughness of a comparative example of a sputtering target according.

As an comparative example, a sputtering target was made from Ti having a crystal grain size of approximately 60 μm. This sputtering target was prepared according to a conventional production method and not subjected to the mirror treatment on the sputter surface. FIG. 3 shows results of measurement of the surface roughness of the sputter surface of this sputtering target. Note that the scale used in FIG. 3 is different from the scale used in FIG. 2. As shown in FIG. 3, the sputter surface of this sputtering target is very rough having an arithmetic mean roughness Ra of approximately 0.05 μm.

Comparative Example 2

As another comparative example, a sputtering target was prepared from Ti having a crystal grain size of about 10 μm. This sputtering target was prepared according to a conventional production method and not subjected to the mirror treatment on the sputter surface. This sputtering target was found to have a similar surface roughness as the comparative example 1 and the arithmetic mean roughness Ra of the sputter surface was approximately 0.05 μm.

Figure 4:
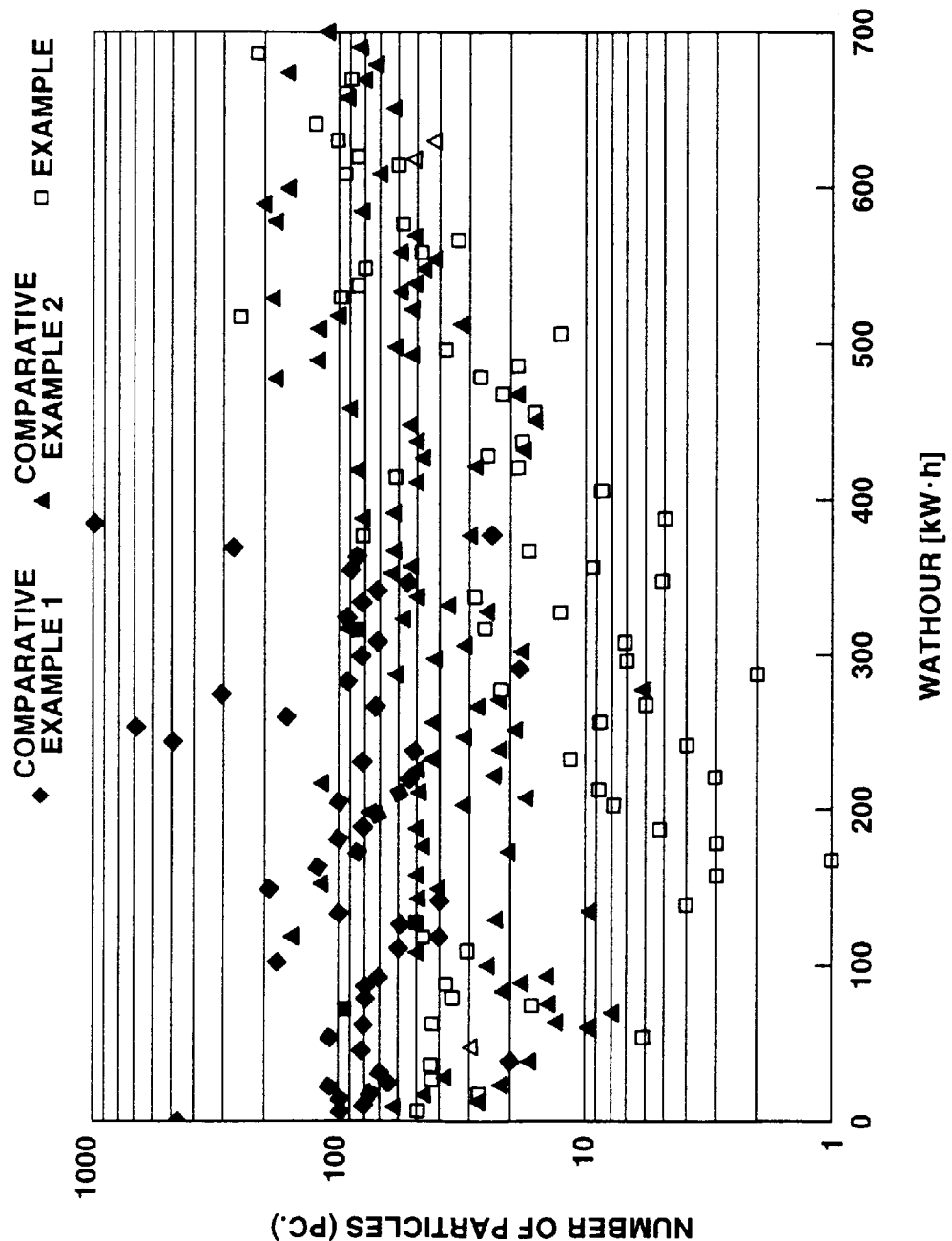
FIG. 4 shows results of measurement of particles generated.

Example and Comparative Examples 1 and 2 were used for reactive sputtering to form Ti—N films, so as to measure the amount of particles generated during the reactive sputtering. FIG. 4 shows results of the measurement. Note that in FIG. 4, the horizontal axis indicates a watthour of power applied to the sputtering target, which is equivalent to a so-called target life, whereas the vertical axis indicates the number of particles whose size is 0.3 mm or above generated when the Ti—N films were formed.

As shown in FIG. 4, the sputtering target of Example 2 having a smaller crystal grain size than the sputtering target of Example 1 generated smaller amount of particles. Furthermore, the sputtering target prepared according to the present invention generated still less particles than the sputtering target of Comparative Example 2. Especially during a middle life of the sputtering process, i.e., during a period when the watthour is 200 to 400 kWh, generation of particles was significantly reduced in comparison to the comparative examples.

The aforementioned results show that, by making the crystal grain size smaller and carrying out the mirror treatment to the sputter surface, it is possible to significantly reduce the amount of particles generated from the sputtering target during sputtering.

Moreover, after forming the Ti—N films by the reactive sputtering by using the sputtering targets of the present embodiment and Comparative Examples 1 and 2, measurement was made to determine the contamination levels of the sputter surfaces caused by the reactive gas and the like used for the reactive sputtering. Here, the measurement of the contamination levels was carried out by using the X-ray electron spectroscopy (ESCA: electron spectroscopy for chemical analysis) so as to determine the contamination by O, N, and C.

Figure 5:
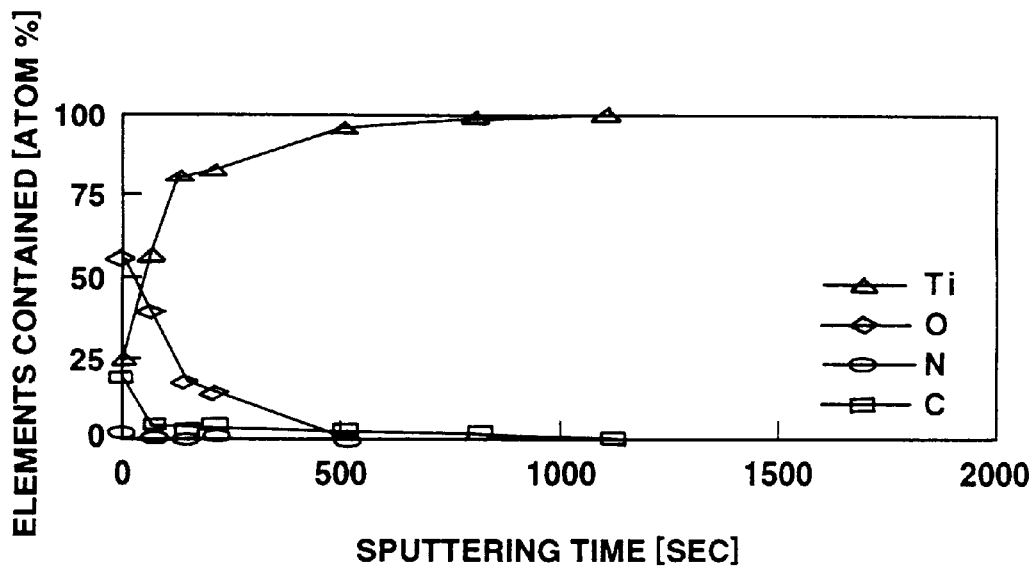
FIG. 5 shows a contaminated state of the sputtering target according to the embodiment.
Figure 6:
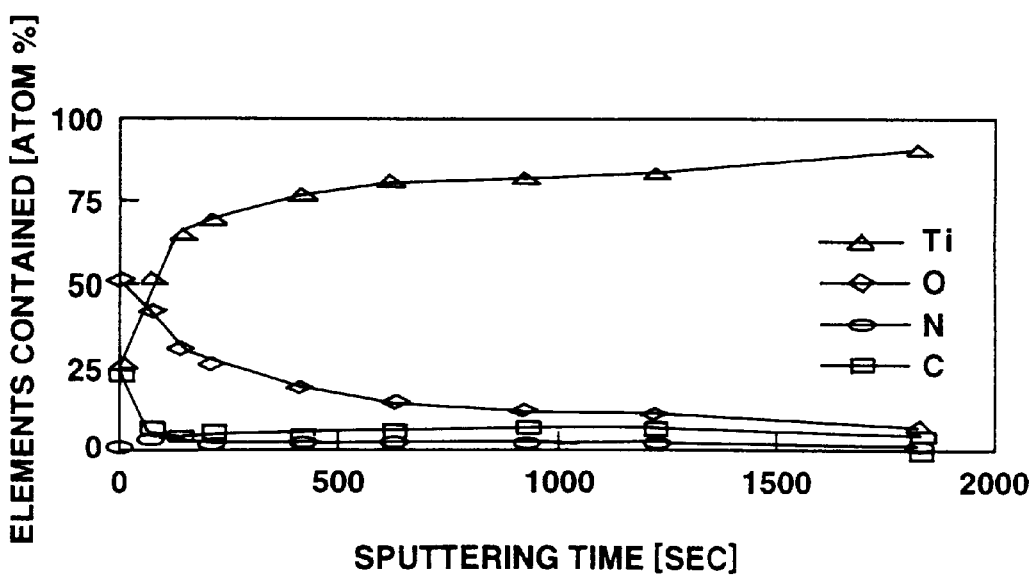
FIG. 6 shows a contaminated state of the comparative example of the sputtering target.

FIG. 5 shows the measurement result of the sputtering target of the present embodiment, and FIG. 6 shows the measurement result of the sputtering target of Example 2. It should be noted that the measurement of the contamination level by using the X-ray electron spectroscopy was carried by carrying out sputtering at the 0.1 nm/sec sputtering rate.

In FIG. 5 and FIG. 6, the horizontal axis indicates the sputtering time. For example, the sputtering time of 1000 sec corresponds to a depth of 100 nm from the sputter surface of the sputtering target.

As can be seen from FIG. 5, in the case of the sputtering target of the present embodiment, contamination is almost terminated at the depth of about 100 nm from the sputter surface. That is, only a shallow portion is contaminated. On the contrary, as shown in FIG. 6, in the case of the sputtering target of Comparative Example 2, contamination is not terminated completely even at a depth of about 200 nm from the sputter surface, reaching a very deep portion. From this result, it can be understood that the mirror treatment on the sputter surface also has an effect to suppress contamination of the sputtering target by a reactive gas or the like used for reactive sputtering.

Description will now be directed to nodules which are considered to be one of the causes which generate particles.

A nodule is a small protruding portion generated on the surface of the sputtering target when sputtering is carried out. Generally, it can be said that when nodules are formed, particle generation is increased. The reason of this is considered to be that when a nodule exist, a plasma sate around the nodule becomes unstable.

A process of generation of such a nodule will be explained below with reference to FIG. 7.

When sputtering is carried out, particles are generated from a sputtering target. Note that when a sputtering target made from Ti is used for reactive sputtering to form a Ti—N film, normally particles generated consist of Ti which is a sputtering source and impurities of O, C, N caused by the reactive gas or the like.

Figure 7A:
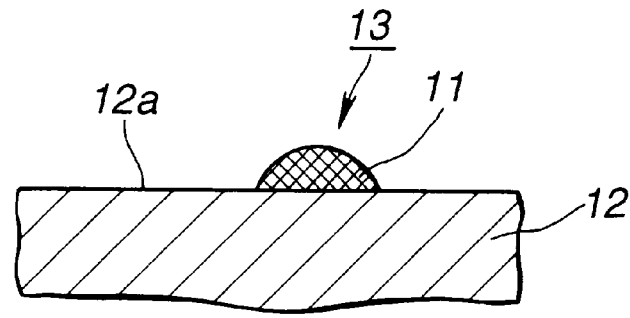
FIG. 7 shows a nodule generation process.

As shown in FIG. 7A, when such a particle 11 adheres a surface 12a of the sputtering target 12, a nodule 13 is formed. Here, FIG. 7A shows the nodule 13 formed by the particle 11 adhering to the surface 12a of the sputtering target 12 at an early stage of sputtering.

Figure 7B:
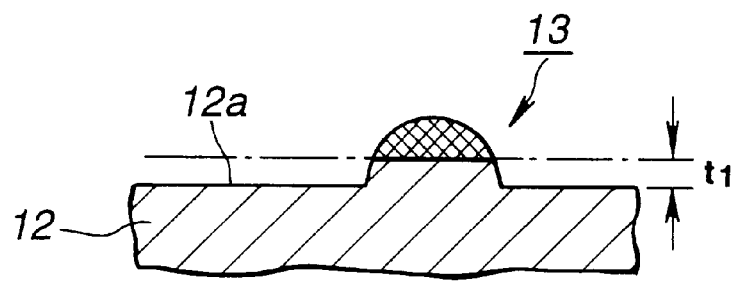
Figure 7C:
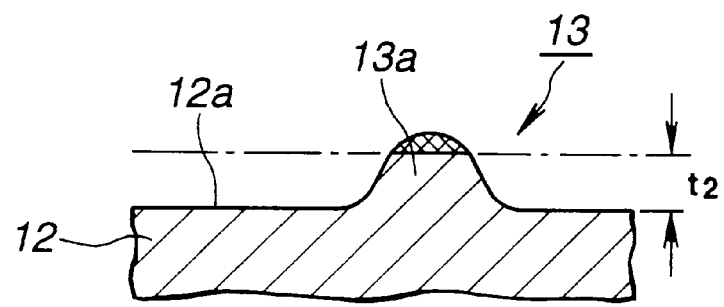

After this, sputtering proceeds, leaving a portion immediately below the nodule 13 unchanged because of the masking effect. That is, this portion is not sputtered and remains as it is as shown in FIG. 7B and FIG. 7C. In FIG. 7B, sputtering has proceeded to the depth of t1 of the sputtering target 12. In FIG. 7C, the sputtering further proceeded to the depth of t2 of the sputtering target 12.

As a result, the nodule 13 protrude from the sputter surface by the depth of t2. Note that the nodule 13 thus generated is a portion of the sputtering target 12 itself which has remained without being sputtered, and the crystal of the nodule 13a is continuous to the crystal of the sputtering target 12.

As has bee described above, the nodule 13 is normally formed by the particle 11 generated and adhering to the surface 12a of the sputtering target 12 at an early stage of sputtering, so as to serve as a core of the nodule. When such a nodule 13 is generated, the particle generation is increased as described above.

When a sputtering target is prepared according to the present invention, the sputtering target has a sputter surface which has been subjected to the mirror treatment and accordingly, generates a reduced amount of particles. That is, the number of particles which may serve as cores of nodules is reduced. Consequently, when the present invention is applied, nodule generation is reduced and particle generation caused by nodules is also reduced. As shown in FIG. 4, in the case of the sputtering target prepared according to the present invention, particle generation is significantly reduced in the middle life, which is considered to come from the significant reduction in the number of particles caused by such nodules.

As is clear from the aforementioned, according to the present invention, the sputtering target has a sputter surface having an arithmetic mean roughness Ra of 0.01 μm or below, enabling to reduce the number of particles generated during sputtering.

Consequently, according to the present invention, it is possible to reduce defects caused by particles when producing a semiconductor device or the like, thus enabling to enhance the production yield.

What is claimed is:

1. A sputtering target made of Ti or a Ti alloy whose sputter surface has an arithmetic mean roughness Ra of 0.01 μm or less.

2. A sputtering target as claimed in claim 1, wherein said sputter surface is a concave plane having a predetermined curvature R.

3. A sputtering target as claimed in claim 1, wherein said sputtering target is made from Ti or Ti alloy.

4. A sputtering target production method, said method comprising the steps of:
   providing a sputter target made of Ti or a Ti alloy; and
   subjecting a sputter surface of the sputter target to a mechanical mirror polishing treatment until the sputter surface has an arithmetic mean roughness Ra of 0.01 μm or less.

5. A sputtering target production method as claimed in claim 4, wherein said mirror treatment is carried out by mechanochemical polishing.

6. The sputtering target of claim 1, wherein the target has crystal grains sized 20 μm or smaller.

* * * * *